US008486190B2

(12) United States Patent  
Imai et al.

(10) Patent No.: US 8,486,190 B2  
(45) Date of Patent: Jul. 16, 2013

(54) PROCESS FOR PRODUCING SINGLE CRYSTAL

(75) Inventors: Katsuhiro Imai, Nagoya (JP); Makoto Iwai, Kasugai (JP); Takatomo Sasaki, Suita (JP); Yusuke Mori, Suita (JP); Fumio Kawamura, Suita (JP)

(73) Assignees: NGK Insulators, Ltd., Nagoya (JP); Osaka University, Suita (JP)

( * ) Notice: Subject to any disclaimer, the term of this patent is extended or adjusted under 35 U.S.C. 154(b) by 1305 days.

(21) Appl. No.: 12/234,799

(22) Filed: Sep. 22, 2008

(65) Prior Publication Data

US 2009/0038539 A1 Feb. 12, 2009

Related U.S. Application Data

(63) Continuation of application No. PCT/JP2007/053857, filed on Feb. 22, 2007.

(30) Foreign Application Priority Data

Mar. 23, 2006 (JP) ................................. 2006-080613

(51) Int. Cl.
*C30B 9/04* (2006.01)

(52) U.S. Cl.
USPC ................... 117/77; 117/75; 117/76; 117/81; 117/68

(58) Field of Classification Search
USPC ............................. 117/68, 81, 78, 77, 76, 75
See application file for complete search history.

(56) References Cited

U.S. PATENT DOCUMENTS

| 5,603,876 | A | * | 2/1997 | Honma et al. ............... 264/666 |
| 6,270,569 | B1 | | 8/2001 | Shibata et al. |
| 7,833,347 | B2 | * | 11/2010 | Iwai et al. ...................... 117/73 |
| 8,241,422 | B2 | * | 8/2012 | Iwai et al. ...................... 117/68 |
| 2003/0164138 | A1 | | 9/2003 | Sarayama et al. |
| 2005/0048686 | A1 | | 3/2005 | Kitaoka et al. |
| 2005/0098090 | A1 | | 5/2005 | Hirota et al. |
| 2007/0209575 | A1 | | 9/2007 | Iwai et al. |

FOREIGN PATENT DOCUMENTS

| JP | 11-060394 A1 | 3/1999 |
| JP | 2002-293696 A1 | 10/2002 |
| JP | 2003-292400 A1 | 10/2003 |
| JP | 2005-119893 A1 | 5/2005 |
| JP | 2005-154254 A1 | 6/2005 |
| JP | 2005-175276 A1 | 6/2005 |
| JP | 2006-008416 A1 | 1/2006 |
| WO | WO 2005/095682 A1 | 10/2005 |
| WO | 2006/098458 A1 | 9/2006 |

OTHER PUBLICATIONS

U.S. Appl. No. 12/181,402, filed Jul. 29, 2008, Iwai et al.
U.S. Appl. No. 12/190,230, filed Aug. 12, 2008, Iwai et al.

(Continued)

*Primary Examiner* — Bob M Kunemund
(74) *Attorney, Agent, or Firm* — Burr & Brown

(57) ABSTRACT

A raw material mixture containing an easily oxidizable material is weighed. The raw material mixture is melted and then solidified within a reaction vessel 1 set in a non-oxidizing atmosphere to thereby produce a solidified matter 19. The reaction vessel 1 and the solidified matter 19 are heated in a non-oxidizing atmosphere within a crystal growth apparatus to melt the solidified matter to thereby produce a solution. A single crystal is grown from the solution.

6 Claims, 5 Drawing Sheets

OTHER PUBLICATIONS

U.S. Appl. No. 12/192,428, filed Aug. 15, 2008, Iwai et al.
U.S. Appl. No. 12/212,722, filed Sep. 18, 2008, Iwai et al.
U.S. Appl. No. 12/234,786, filed Sep. 22, 2008, Imai et al.
U.S. Appl. No. 12/284,470, filed Sep. 22, 2008, Ichimura et al.

* cited by examiner

PROCESS FOR PRODUCING SINGLE CRYSTAL

FIELD OF THE INVENTION

The present invention relates to a method for producing a single crystal using an easily oxidizable material such as Na as flux.

BACKGROUND OF THE INVENTION

Description of Related Art

Gallium nitride-based III-V nitride, which is attracting attention as an excellent blue light emitting element, is put into practical use in light emitting diode field, and expected also as an optical pickup blue-violet semiconductor laser element. In a process for growing a gallium nitride single crystal by Na flux method, mixed gas of nitrogen and ammonia is used with an atmospheric pressure of 10 to 100 atms, for example, in Japanese Patent Publication (Laid-Open) No. 2002-293696A. In also Japanese Patent Publication (Laid-Open) No. 2003-292400A, the atmospheric pressure during the growth is 100 atm or less, with 2, 3 and 5 MPa (about 20 atm, 30 atm and 50 atm) being used in working examples thereof.

On the other hand, the present inventors disclosed a method for efficiently growing a gallium nitride single crystal under a specific condition by use of a hot isostatic pressing (HIP) apparatus in Japanese Patent Application No. 2004-103093 (WO 2005/095682 A1).

SUMMARY OF THE INVENTION

However, it is proved that the crystal growth by such flux method using heating and pressurizing apparatus involves the following problem. That is, in conventional growth using a muffle furnace, it is easy to prevent oxidation of raw materials by atmospheric oxygen, since operations of weighing the raw materials, charging them into a crucible and hermetically sealing the crucible in a stainless hermetic container with valve are performed within a glove box without exposing the raw materials to the atmosphere, and the vessel is then taken out of the glove box. However, the hermetic container with valve cannot be used within the HIP apparatus. Since a lid of a pressure-resistant container of the HIP apparatus is opened, and closed after the crucible is directly disposed within the container, the raw materials may be exposed to the atmosphere and oxidized during the operation.

As a result, dissolution of nitrogen at the surface of flux is inhibited to reduce the nitriding rate of gallium, and resulting gallium nitride single crystals are blackened.

The present inventors further disclosed in Japanese Patent Application No. 2005-70649 (WO 2006/098458) to store a flux raw material in a container with opening, airtightly seal the opening of the container, and lay the opening in an open state by melting a sealant in heating and pressurizing treatment to thereby allow the inside of the container to communicate with the external non-oxidizing atmosphere.

However, it has been found from further examinations by the present inventors that a room for improvement is actually left even in such a method. That is, metallic sodium or the like is weighed within a glove box laid in a low-moisture content and low-oxygen concentration environment with dew point of $-80°$ C. and oxygen concentration of 1 ppm or less since it is easily oxidized. Even in such an environment, the surface of sodium metal is slightly whitened in about several minutes during weighing. The weighing operation requires 30 minutes even in a short case and about several hours if the number of samples is large, depending on the situation. When the number of samples is particularly large, the dew point is gradually reduced to further facilitate oxidation of the surface of sodium metal. Therefore, the dissolution of nitrogen at the surface of flux is inhibited to reduce the nitriding rate of gallium as described above, depending on the lot, and the resulting gallium nitride single crystals are blackened.

An object of the present invention is to improve, in growth of a single crystal using an easily oxidizable material such as Na as flux in a non-oxidizing atmosphere, the nitriding rate during the growth of single crystal and to prevent coloring of the resulting single crystal.

The present invention provides a method for producing a single crystal, the method comprising the steps of:

weighing a raw material mixture comprising an easily oxidizable material;

melting and solidifying the raw material mixture within a reaction vessel to provide a solidified matter; and heating the reaction vessel and the solidified matter in a non-oxidizing atmosphere within a crystal growth apparatus to melt the solidified matter to produce a solution and growing the single crystal from the solution.

According to the present invention, each component of the raw material mixture is weighed, for example, within a glove box, and then charged into the reaction vessel. The raw material mixture is melted by heating the reaction vessel, and then solidified once. On this stage, the surface area of the raw materials contacting with the atmosphere is minimized, and oxidation of the easily oxidizable material in the solidified matter is minimally suppressed. The reaction vessel containing the solidified matter is then set in a predetermined growth apparatus, and heated in a non-oxidizing atmosphere to melt the solidified matter, and growth of single crystal by the flux method is carried out.

DETAILED DESCRIPTION OF THE INVENTION

The present invention will be described in further detail with referring to the accompanying drawings accordingly.

Figure 1:
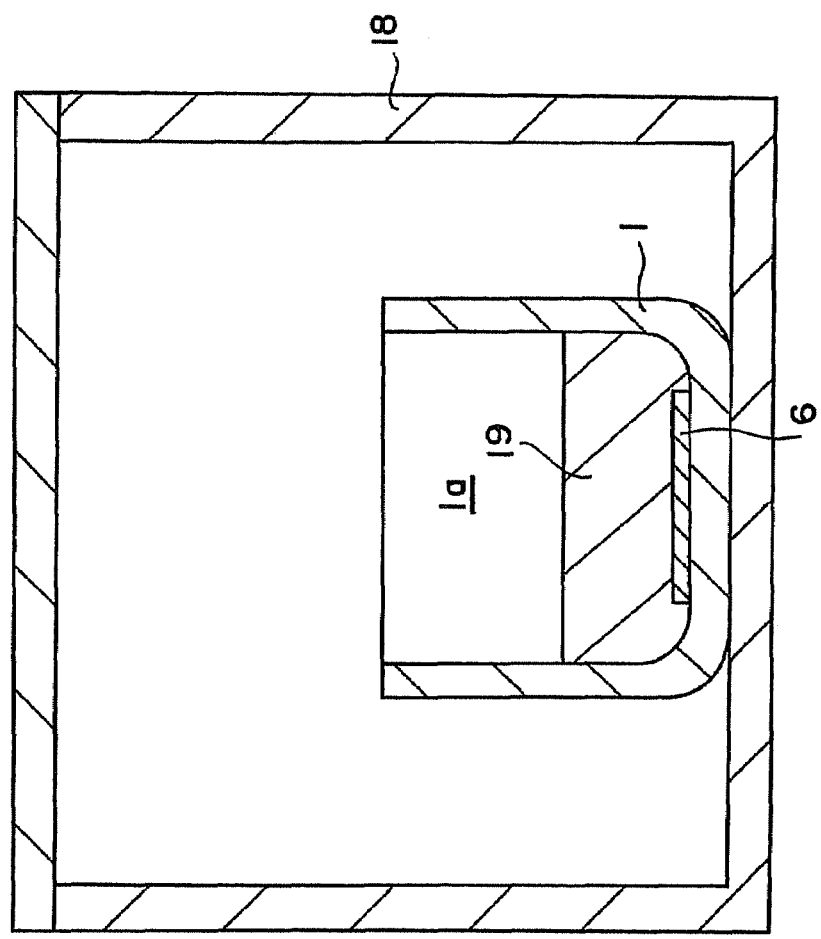
FIG. 1 is a schematic sectional view of a glove box, in which a solidified matter 19 is produced within a reaction vessel 1.

Each raw material constituting a raw material mixture is weighed within a glove box laid in a non-oxidizing atmosphere, and hermetically sealed in an inner space 1a of a reaction vessel 1 in the non-oxidizing atmosphere (FIG. 1). The reaction vessel 1 may be provided with a lid. In this example, the raw material mixture is composed of an easily oxidizable material and the other material. A seed crystal substrate 6 is set on a bottom portion of the reaction vessel 1. The reaction vessel 1 is heated in this state within the glove box to melt the raw materials.

The solidified matter production step within the reaction vessel may be performed by the following methods.

(1) The raw material mixture is entirely melted within the reaction vessel, and then solidified. For example, the reaction vessel 1 is stored within a glove box 18 as schematically shown in FIG. 1. The inside of the glove box 18 is laid in the non-oxidizing atmosphere. The seed crystal substrate 6 is set on the bottom portion of the reaction vessel. The raw material mixture is melted and solidified within the reaction vessel 1 to produce a solidified matter 19 composed of a substantially homogeneous composition. The reaction vessel 1 is put into an outer container in this state, and the outer container is taken out of the globe box 18, and set within a single crystal growth apparatus.

Figure 2:
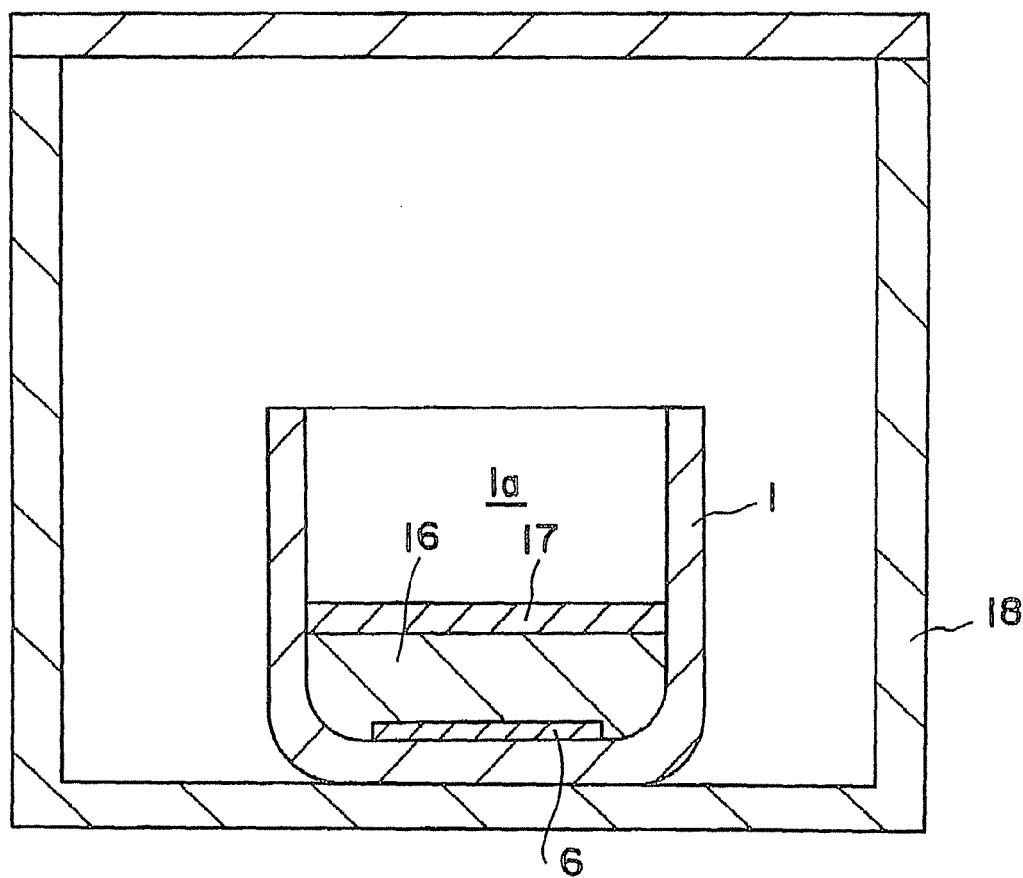
FIG. 2 is a schematic sectional view of the glove box, in which a lower-side solidified matter 16 and a surface-side solidified matter 17 are produced within the reaction vessel 1.

(2) At least the easily oxidizable material of the raw material mixture is melted in the reaction vessel, and then solidified. The material other than the easily oxidizable material is placed thereon, melted and then solidified. For example, the reaction vessel 1 is stored within the glove box 18 as schematically shown in FIG. 2. The inside of the glove box 18 is laid in the non-oxidizing atmosphere. The seed crystal substrate 6 is set on the bottom portion of the reaction vessel. At least the easily oxidizable material of the raw material mixture is melted and solidified within the reaction vessel 1 to produce a lower-side solidified matter 16. The lower-side solidified layer may contain the material other than the easily oxidizable material. The material other than the easily oxidizable material is then melted and solidified on the lower-side solidified matter 16 to produce a surface-side solidified matter 17 thereon. The reaction vessel 1 is put into an outer container in this state, and the outer container is taken out of the glove box 18, and set within a single crystal growth apparatus.

If the easily oxidizable material is simply mixed with the other material, the oxidation microscopically proceeds since the surface area contacting with the atmosphere of the easily oxidizable material becomes relatively large. On the other hand, in the example (1), the easily oxidizable material is melted once in a state where it is mixed with the other material, and then solidified. Therefore, the surface area exposed to the atmosphere of the easily oxidizable material is minimized and thus, the oxidation is seemed to be remarkably suppressed in microscopic observation.

In the example (2), since the solidified layer 16 containing the easily oxidizable material is covered with the solidified layer 17 mainly composed of the material that is not easily oxidized, in addition to the action and effect in the example (1), the oxidation of the easily oxidizable material is further suppressed to enhance the nitriding rate in the single crystal, and the coloring is thus suppressed.

The reaction vessel is then set within a single crystal growth apparatus. In an example shown in FIG. 3, for example, an outer container 21 and the reaction vessel 1 are set within a pressure vessel 12 of a HIP (hot isostatic pressing) apparatus 11. A mixed gas cylinder not shown is provided outside the pressure vessel 12. The mixed gas cylinder is filled with mixed gas having a predetermined composition, and the mixed gas is compressed to a predetermined pressure by a compressor, and supplied into the pressure vessel 12 through a supply pipe 15 as shown by arrow A. Of this atmosphere, nitrogen is used as a nitrogen source, and inert gas such as argon gas suppresses vaporization of the solution. The pressure of the atmosphere is monitored by a pressure gauge not shown. A heater 14 is set around the outer container 21 and the reaction vessel 1 so that the growth temperature within the vessel can be controlled.

Figure 4:
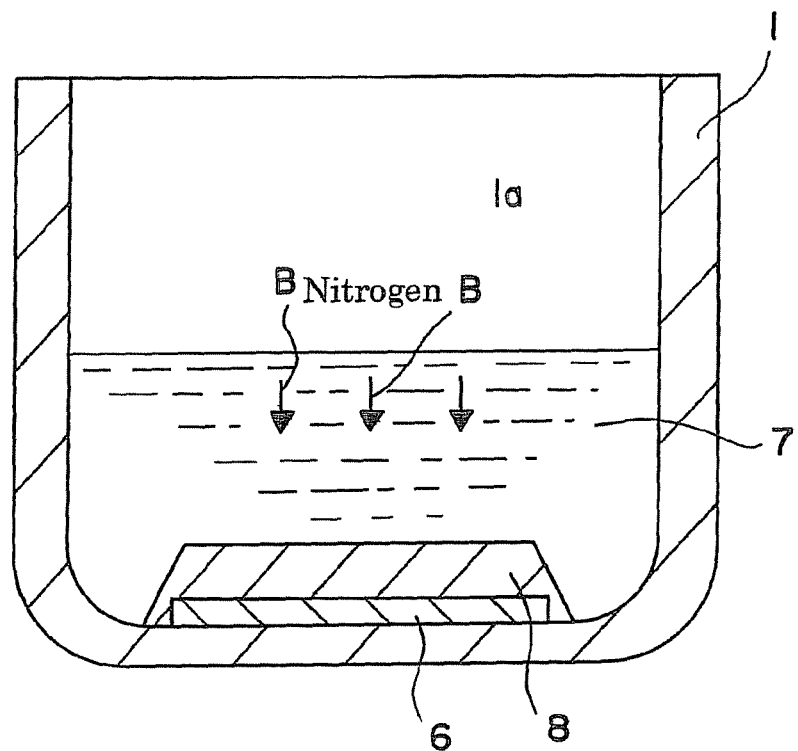
FIG. 4 is a schematic sectional view of the reaction vessel 1 showing a state of growing a single crystal with melted raw materials.

When the reaction vessel 1 is heated and pressurized within the pressure vessel 12, the mixed raw materials are entirely melted within the reaction vessel 1 to produce a solution 7, as shown in FIG. 4. As a predetermined single crystal growth condition is retained then, a single crystal layer 8 is grown on the seed crystal substrate 6 with stable supply of nitrogen from the inner space 1a into the solution 7.

According to the present invention, since the oxidation of the easily oxidizable material is remarkably suppressed, and nitrogen is satisfactorily supplied into the solution as shown by arrow B, nitride single crystals can be grown uniformly.

Figure 5:
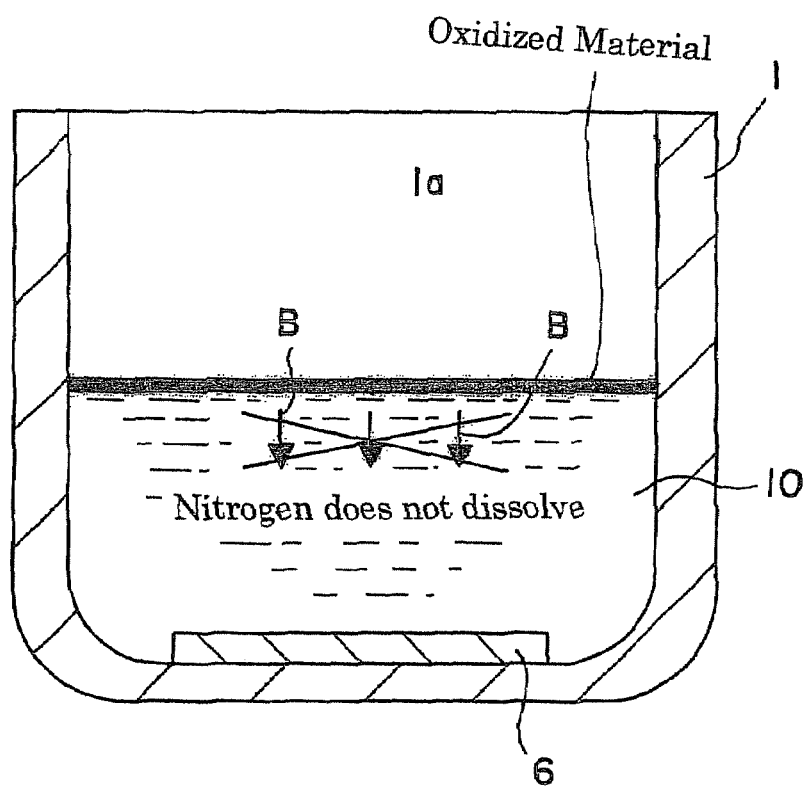
FIG. 5 is a schematic sectional view of the reaction vessel 1 showing a state of growing a single crystal with oxidized raw materials.

When the easily oxidizable material e.g. sodium metal is oxidized, in contrast, the oxidized raw materials gather in the vicinity of the surface of a solution 10, for example as shown in FIG. 5, during heating treatment to obstruct dissolution of nitrogen in the solution as shown by arrow B. Therefore, the nitrogen cannot be satisfactorily supplied into the solution. Consequently, a single crystal film of good quality cannot be formed on the seed crystal 6 with good productivity, or a problem such as coloring may be caused in the resulting single crystal.

In the present invention, the kind of the non-oxidizing atmosphere is not particularly limited and, for example, an inert gas atmosphere of nitrogen, argon or the like and a reductive atmosphere of carbon monoxide, hydrogen or the like are adaptable. The present invention is particularly suitable to a nitrogen-containing atmosphere. The nitrogen-containing atmosphere may contain non-oxidizing gas other than nitrogen, for example, inert gas such as argon or reductive gas, although it may be composed of only nitrogen.

In the present invention, the apparatus for heating the raw material mixture to produce the solution in the single crystal growth apparatus is not particularly limited. A hot isostatic pressing apparatus is preferred as such device, but, other atmospheric pressure type heating furnaces are also usable.

The easily oxidizable material to which the present invention is applicable is not particularly limited. The easily oxidizable material means a material for which oxidization is easily observed when it contacts with the atmosphere at ordinary temperature, for example, a material such that the oxidization is observed within 1 minute. The easily oxidizable material may be a powder (or powder mixture) or a molded body.

In a preferred embodiment, the easily oxidizable material is composed of, for example, one or more metals selected from the group consisting of alkali metals and alkali earth metals, or the alloy thereof. As such metals, sodium, lithium and calcium are particularly preferred, and sodium is most preferred.

As the material other than the easily oxidizable material to be added to the raw material mixture, for example, aluminum, gallium, indium, tin, zinc, bismuth and antimony can be given.

As a dopant, a small amount of impurity elements can be added. For example, silicon can be added as n-type dopant.

By the growing method according to the present invention, for example, the following single crystals can be suitably grown: GaN, AlN, InN, mixed crystal thereof (AlGaInN), and BN The easily oxidizable material may behave as a reactive component or in a predetermined reaction, or may exist as one unreactive component in the solution.

The heating temperature in melting the raw material mixture can be selected depending on the kind of easily oxidizable material without particular limitation. The heating temperature can be set, for example, to 100 to 200° C.

The heating temperature and pressure in the single crystal growing process can be selected depending on the kind of single crystal to be grown without particular limitation. The heating temperature can be set, for example, to 800 to 1500° C. The pressure is not particularly limited either, but is preferably 1 MPa or more, further preferably 5 MPa or more. The upper limit of the pressure is not particularly regulated, but can be set, for example, to 200 MPa.

The vessel for performing the reaction can be formed of any airtight material which is durable in an intended heating and pressurizing condition without particularly limitation. Examples of such material include a high-melting point metal such as metallic tantalum, tungsten or molybdenum, an oxide such as alumina, sapphire or yttria, a nitride ceramics such as aluminum nitride, titanium nitride, zirconium nitride or boron nitride, a carbide of high-melting point metal such as tungsten carbide or tantalum carbide, and a thermal decomposition product such as p-BN (pyrolytic BN) or p-Gr (pyrolytic graphite).

Further concrete single crystals and growing procedures thereof will be then described.

(Growth Example of Gallium Nitride Single Crystal)

The present invention can be used to grow gallium nitride single crystal using flux containing at least sodium metal. A gallium raw material is mixed to the flux. As the gallium raw material, gallium single metal, a gallium alloy or a gallium compound are applicable, and gallium single metal is suitably used from the viewpoint of handling.

The flux can include a metal other than sodium e.g. lithium. Although the gallium raw material and the flux raw material such as sodium may be used in an appropriate proportion, excess use of Na is generally considered. This is, of course, not limitative.

In this embodiment, the growth of gallium single crystals is carried out in an atmosphere consisting of mixed gas containing nitrogen gas under a total pressure ranging from 300 atm to 2000 atm. By setting the total pressure to 300 atm or more, gallium nitride single crystals of good quality could be grown, for example, in a high-temperature range of 900° C. or higher, more preferably 950° C. or higher. This reason is not known exactly but is assumed to be attributable to that the nitrogen solubility is increased according to temperature rise to promote efficient dissolution of nitrogen in the growth solution. When the total pressure of the atmosphere exceeds 2000 atm, the density of the high-pressure gas rather gets close to that of the growth solution, so that it becomes difficult to retain the growth solution within the vessel.

TABLE 1

Densities of various materials (g/cm$^3$)

| | Sodium metal | Nitrogen | Argon |
|---|---|---|---|
| 800° C. · 1 atm | 0.75 | 0.0003 | 0.0004 |
| 927° C. · 300 atm | | 0.08 | 0.11 |
| 927° C. · 1000 atm | | 0.21 | 0.33 |
| 927° C. · 2000 atm | | 0.3 (estimation) | 0.5 (estimation) |

In a preferred embodiment, the nitrogen partial pressure in the growing atmosphere is set to 100 atm or more and 2000 atm or less. By setting the nitrogen partial pressure to 100 atm or more, gallium nitride single crystals of good quality could be grown in a high-temperature range of, for example, 1000° C. or higher by promoting the dissolution of nitrogen in the solution. From this point of view, the nitrogen partial pressure in the atmosphere is set further preferably to 200 atm or more. The nitrogen partial pressure is set also preferably to 1000 atm or less from the practical point of view.

Although the gas other than nitrogen in the atmosphere is not particularly limited, inert gas is preferred, and argon, helium or neon is particularly preferred. The partial pressure of the gas other than nitrogen corresponds to a value obtained by subtracting the nitrogen partial pressure from the total pressure.

In a preferred embodiment, the growth temperature of gallium nitride single crystal is set to 950° C. or higher, further preferably to 1000° C. or higher, and even in such a high-temperature range, gallium nitride single crystals of good quality can be grown. The growth at high temperature and high pressure may probably improve the productivity.

Although the upper limit of the growth temperature of gallium nitride single crystal is not particularly limited, an excessively high growth temperature makes the crystal growth difficult. Therefore, the growth temperature is set preferably to 1500° C. or lower. From this viewpoint, the temperature is set further preferably to 1200° C. or lower.

As the material of the growth substrate for epitaxially growing the gallium nitride crystal, for example, sapphire, AlN template, GaN template, silicon single crystal, SiC single crystal, MgO single crystal, spinel (MgAl$_2$O$_4$), LiAlO$_2$, LiGaO$_2$ and perovskite composite oxide such as LaAlO$_3$, LaGaO$_3$ or NdGaO$_3$ can be given, although the material is not particularly limited thereto. A cubic perovskite composite oxide represented by the composition formula [A$_{1-y}$(Sr$_{1-x}$Ba$_x$)$_y$] [(Al$_{1-z}$Ga$_z$)$_{1-u}$·Du]O$_3$ (where A is a rare earth element; D is one or more elements selected from the group consisting of niobium and tantalum; y=0.3 to 0.98; x=0 to 1; z=0 to 1; u=0.15 to 0.49; and x+z=0.1 to 2) is also usable. Further, SCAM (ScAlMgO$_4$) is also usable.

(Growth Example of AlN Single Crystal)

The present invention could be confirmed to be effective for growth of AlN single crystals by pressurizing a melt including flux containing at least aluminum and alkali earth metal in a nitrogeneous atmosphere under a specific condition.

EXAMPLES

Example 1

Figure 3:
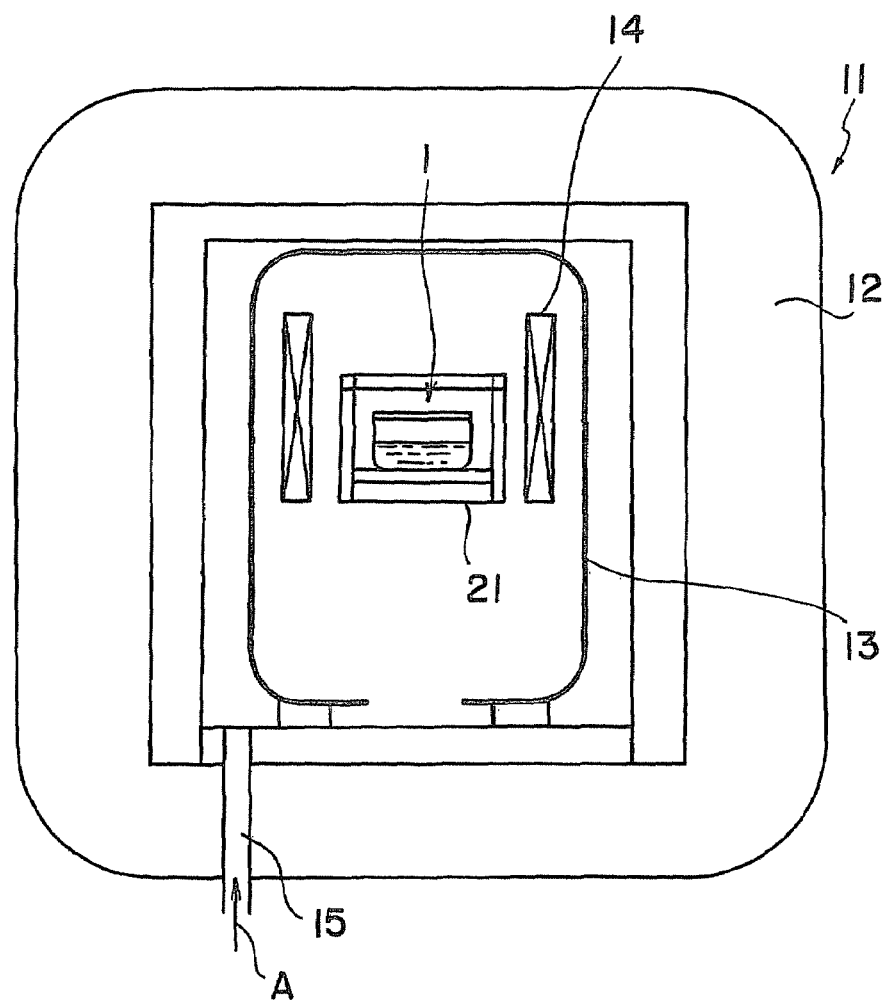
FIG. 3 is a schematic view of a HIP apparatus, in which the reaction vessel 1 of FIGS. 1 and 2 is set.

Growth of GaN single crystal on the seed crystal substrate 6 was carried out according to the method described with reference to FIGS. 1, 3 and 4. Concretely, the seed crystal substrate 6 was disposed on the bottom of a crucible 1. As the seed crystal substrate, an AlN template substrate, GaN template substrate or free-standing GaN single crystal substrate with φ of 2 inches was used. The substrate was horizontally placed on the bottom of the crucible so that the single crystal thin film of the template was upward, or the Ga surface of the free-standing GaN single crystal substrate was upward. The AlN template substrate is a substrate obtained by epitaxially growing an AlN single crystal thin film on a sapphire substrate in a thickness of 1 micron, and the GaN template substrate is a substrate obtained by epitaxially growing a GaN single crystal thin film on a sapphire substrate in a thickness of 3 microns.

Metal Na 30 g (easily oxidizable material), metal Ga 20 g, and metal Li 30 mg were weighed within a glove box. All of these raw materials were charged in the crucible 1, and melted by heating to 200° C., and then cooled to room temperature.

When the metallic raw materials are granular, the raw materials are easily oxidized by trace oxygen contained in the atmosphere due to the large surface area. However, by melting the raw materials as described above, the surface area contacting with the atmosphere can be minimized, and the oxidation of the raw materials can be thus minimally suppressed. The crucible 1 was put into a stainless container after thinly scraping off the raw materials oxidized during the melting operation. The stainless container was taken out of the glove box, and disposed within a growth apparatus.

After a lid of the growth apparatus was closed, gas substitution was started using nitrogen gas. The stainless container was exposed to the atmosphere for about 20 minutes while being taken out of the glove box and disposed within the apparatus. The container was raised in temperature and pressure to 900° C. and 50 atm over one hour using nitrogen gas, and then retained at 900° C. for 100 hours. After naturally allowed to cool to room temperature, the crucible was taken out of the growth apparatus, and treated with ethanol to thereby dissolve Na and Li. Thereafter, the remaining Ga was removed by dipping in diluted hydrochloric acid to take out the resulting GaN single crystal. The GaN single crystal had a substantially circular shape with a diameter size of φ 2 inches and a thickness of about 3 mm. The color of the crystal was brownish to a negligible extent. As a result of impurity analysis of the grown crystal by EPMA (electron probe microanalysis), trace oxygen was detected.

Example 2

Growth of GaN single crystal on the seed crystal substrate 6 was carried out in the same manner as in Example 1, except for the raw material preparation procedure. The raw material preparation was carried out in the following procedure. Metal Na 30 g, metal Ga 20 g, and metal Li 30 mg were weighed within the glove box. The metal Na and metal Li were put in the crucible 1 and melted by heating to 200° C., and then solidified by cooling to room temperature. After thinly scraping off the raw materials oxidized during this operation, Ga was put in the crucible 1 and melted by heating to 50° C. The melted Ga 17 was cooled and solidified so as to cover the whole surface of the raw materials 16 charged first.

After cooling up to completion of the solidification, the crucible was put into a stainless container, and the stainless container was taken out of the glove box and disposed within a growth apparatus. The crystal growth and recovery of single crystal were carried out in the same procedure as in Example 1. The recovered GaN single crystal had a substantially circular shape with a diameter size of φ 2 inches and a thickness of about 3 mm. The crystal was substantially colorless and transparent. As a result of impurity analysis of the grown crystal by EPMA, no oxygen was detected. It was inferred from this result that the oxidation suppressing effect by the procedure of Example 2 is still more considerable than that by the procedure of Example 1.

Comparative Example 1

The GaN growth experiment was carried out in the same manner as in Example 1. The melting of the raw material mixture within the crucible as shown in FIGS. 1 and 2 was not performed. A time of the exposure to the atmosphere was set to a short time of about 10 minutes. The resulting GaN single crystal had a brownish to pale black color. As a result of impurity analysis of the grown crystal by EPMA, oxygen was detected. This is attributable to oxidation of metal Na due to inclusion of the atmosphere within the stainless container during gas substitution.

While specific preferred embodiments have been shown and described, the present invention is never limited by these specific embodiments, and can be carried out with various modifications and substitutions without departing from the scope of the claims of the present invention.

The invention claimed is:

1. A method for producing a single crystal, the method comprising the steps of:
    weighing a mixture comprising an easily oxidizable material and a material for said single crystal in a non-oxidizing atmosphere;
    charging said mixture into a reaction vessel in a non-oxidizing atmosphere;
    melting and then solidifying the mixture within said reaction vessel to produce a solidified matter;
    moving said reaction vessel with said solidified matter in said reaction vessel into a crystal growth apparatus;
    heating the reaction vessel and the solidified matter in a non-oxidizing atmosphere within said crystal growth apparatus to melt the solidified matter to produce a solution;
    and growing the single crystal from the solution.

2. The method for producing a single crystal of claim 1, wherein the solidified matter comprises a lower-side solidified matter containing the easily oxidizable material of the raw material mixture and a surface-side solidified matter composed of a material other than the easily oxidizable material, and wherein the lower-side solidified matter being substantially covered with the surface-side solidified matter.

3. The method for producing a single crystal of claim 1, wherein the solidified matter comprises a substantially homogeneous composition of the raw material mixture.

4. The method for producing a single crystal of claim 1, wherein the easily oxidizable material comprises one or more metals selected from the group consisting of alkali metals and alkali earth metals.

5. The method for producing a single crystal of claim 1, wherein the growth of single crystal is performed under pressurization in a nitrogen-containing atmosphere.

6. The method of claim 5, wherein the growth of single crystal is performed within a hot isostatic pressing apparatus.

* * * * *